(12) United States Patent
Udrea et al.

(10) Patent No.: US 12,310,088 B2
(45) Date of Patent: May 20, 2025

(54) HETEROJUNCTION BASED HALF BRIDGE

(71) Applicant: Cambridge GaN Devices Limited, Cambridge (GB)

(72) Inventors: Florin Udrea, Cambridge (GB); Loizos Efthymiou, Cambridge (GB); Giorgia Longobardi, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 585 days.

(21) Appl. No.: 17/589,509

(22) Filed: Jan. 31, 2022

(65) Prior Publication Data
US 2023/0246019 A1 Aug. 3, 2023

(51) Int. Cl.
| | |
|---|---|
| *H10D 84/01* | (2025.01) |
| *H10D 30/47* | (2025.01) |
| *H10D 62/824* | (2025.01) |
| *H10D 62/85* | (2025.01) |

(52) U.S. Cl.
CPC .......... *H10D 84/01* (2025.01); *H10D 30/475* (2025.01); *H10D 62/824* (2025.01); *H10D 62/8503* (2025.01)

(58) Field of Classification Search
CPC ............. H01L 27/0605; H01L 29/2003; H01L 29/205; H01L 29/7786; H01L 29/1066; H01L 21/8252; H01L 27/085; H01L 29/402; H01L 29/41758
See application file for complete search history.

(56) References Cited

U.S. PATENT DOCUMENTS

| | | | |
|---|---|---|---|
| 2011/0103148 A1* | 5/2011 | Bhalla | H10D 64/251 257/192 |
| 2019/0267456 A1* | 8/2019 | Chen | H01L 29/41725 |
| 2021/0217882 A1 | 7/2021 | Udrea et al. | |
| 2022/0302259 A1* | 9/2022 | Yamagiwa | H01L 27/0207 |

FOREIGN PATENT DOCUMENTS

| | | | | |
|---|---|---|---|---|
| WO | WO-2019012293 A1 * | 1/2019 | | H01L 21/7605 |
| WO | 2020225362 A1 | 11/2020 | | |

OTHER PUBLICATIONS

Infineon EiceDriver Data sheet Rev 2.1 (Year: 2021).*
Strangio et al, Digital and analog TFET circuits: Design and benchmark, 2018, Elsevier, Solid state Electronic, pp. 57-58 (Year: 2018).*

* cited by examiner

*Primary Examiner* — Suberr L Chi
*Assistant Examiner* — William C. Trice, III
(74) *Attorney, Agent, or Firm* — Tarolli, Sundheim, Covell & Tummino LLP

(57) ABSTRACT

We describe a heterojunction based half bridge apparatus formed within a single active area comprising a first heterojunction device and a second heterojunction device, each heterojunction device comprising a drain and a source, each drain comprising a drain contact and each source comprising a source contact; wherein the drain contact of the first heterojunction device and the source contact of the second heterojunction device comprise a common contact. The half bridge apparatus according to the present disclosure may be advantageously more compact and more reliable than existing heterojunction based half bridges.

21 Claims, 10 Drawing Sheets

HETEROJUNCTION BASED HALF BRIDGE

FIELD

The present disclosure relates to half bridge circuits based on semiconductor heterojunction devices. Particularly, but not exclusively, the disclosure relates to a heterojunction based half bridge apparatus based on III-nitride semiconductor based heterojunction devices.

BACKGROUND

Gallium Nitride (GaN) is a wide band gap material with properties that make it a suitable candidate for use in several fields of application (e.g. radio-frequency electronics, optoelectronics, power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

In the last decade, Gallium Nitride (GaN) has increasingly been considered as a very promising material for use in the field of power devices. The application areas range from portable consumer electronics, solar power inverters, electric vehicles, and power supplies. The wide band gap of the material ($E_g$=3.39 eV) results in high critical electric field ($E_c$=3.3 MV/cm) which can lead to the design of devices with a shorter drift region, and therefore lower on-state resistance if compared to a silicon-based device with the same breakdown voltage.

The use of an Aluminium Gallium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1×10$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface has been found to be unstable and lose electron charge under a prior high voltage stress. This phenomenon is known as dynamic Ron or current collapse. When the device is under high voltage stress in the off-state (a high potential is present on the high voltage drain terminal with respect to the source terminal and the gate voltage is at a potential below the threshold voltage to ensure that the device is off), part of the electrons in the 2DEG are lost by trapping mechanisms in either traps in the bulk of the GaN, the transition layer (i.e. the layer placed between the substrate and the GaN buffer) or at the surface of the device. Hot carrier injection in the passivation layer, next to the gate (the control terminal) also may play a role, though this is not believed to be the major contribution to the dynamic Ron phenomenon. This loss of charge from the 2DEG layer to the surrounding traps leads to a subsequent decrease in the conductivity during on-state and thus an increase in the on-state resistance. The effect could be seen also during the switching or when the device is in operation in a real system.

The hot carrier injection and the trapping effect of the electrons in the bulk of the GaN, the transition layer (i.e. the layer placed between the substrate and the GaN buffer) or at the surface of the device, in the vicinity of the gate leads not only to a loss in the 2DEG layer conductivity but is also associated with a shift in the threshold voltage. The trapping and the hot carrier injection are significantly more prominent at higher electric fields. One of the peaks of the electric field occurs at the drain side of the edge of the gate structure.

However, the use of metal field plates has also only been partially successful in reducing the electric field peak. At the same time, if the extension of the field plate is too long towards the drain terminal, it reduces the effective distance of the drift region where the field is accommodated, resulting in a loss of the breakdown voltage.

Another way to alleviate the increase in the on-state resistance is to inject holes during the off-state or during the on-state operation to passivate the bulk or surface traps and prevent or slow down the trapping of electrons in the vicinity of the 2DEG layer (either in the bulk or at the surface).

There are therefore two possible ways to reduce or minimise the effect of the dynamic increase in the on-state resistance, when an off-state stress was a priori present: (i) to design the device in order to reduce the field peaks in the structure, in particular around the gate structure, to reduce or minimise the effect of electron trapping from the 2DEG and/or hot carrier injection, and (ii) and/or to inject holes into the bulk and actively passivate the bulk or surface traps.

There are several theories describing the effect of the injected holes. One possible mechanism is that the injected holes change the electric field distribution from the 2DEG to the substrate, by moving the high fields away from the 2DEG vicinity, towards the substrate. As a result the 2DEG is exposed to lower electric fields which slows down the mechanism of electron trapping in the vicinity of the 2DEG as shown By D. Pagano et al in ["Suppression of substrate coupling in GaN high electron mobility transistors (HEMTs) by hole injection from the p-GaN gate", Appl. Phys. Lett. 115, 203502 (2019), https://doi.org/10.1063/1.5121637]. Note that in the presence of injected holes, the 2DEG still depletes at high voltages during off-state and at very high voltages (closer to nominal breakdown) the whole of the 2DEG is depleted, but the peak of the electric field is moved away from the 2DEG towards the substrate.

Two high voltage devices may be connected in series to create what is commonly described as a half bridge circuit. An example of a standard half bridge circuit is shown in FIG. 1. The transistor whose drain terminal is connected to the mid-point is often referred to as the low side device. The transistor whose source terminal is connected to the mid-point is often referred to as the high side device.

A half bridge circuit may be used in a range of very popular power conversion topologies, for example the DC-to-AC step of a flyback converter. Furthermore, two half bridge circuits may be connected in parallel to produce a full bridge circuit (or H-bridge). A three-phase half bridge may be created by connecting three half bridges in parallel. A three-phase full bridge circuit may be created by connecting three full bridges (six half bridges) in parallel.

Therefore, due to the popularity of the half bridge, manufacturers may often choose to produce a half bridge monolithically at the integrated circuit level. Another option is to co-package two transistors providing a half bridge at the package level. These approaches may be desirable to reduce size, reduce parasitics and minimise costs. Further integration of other circuit blocks whether monolithically or at the package level may offer similar advantages. Additional circuit blocks which might be included are for example gate drivers, level shifters, sense and protection circuits, bootstrap diode. Monolithic integration may be the most desirable in terms of minimizing parasitics, size reduction at component level and system level and potentially reduced component cost and overall system costs.

However, monolithic integration of AlGaN/GaN heterojunction transistors into a half bridge circuit presents some challenges. AlGaN/GaN heterojunction transistors are often lateral devices where the substrate is considered as a fourth terminal (in addition to drain, source, gate). In a single AlGaN/GaN high voltage transistor the substrate is often connected to the source potential, this may be done at device level, package level, printed circuit board (PCB) level. When two AlGaN/GaN high voltage transistors are connected in series to form a half bridge monolithically, the connection of the substrate to source potential of the low side device may create challenges. The on-state performance of the high side device in this scenario may degrade as a vertical potential between the surface terminals of the high side device (drain, source, gate) and the substrate may lead to a partial or full depletion of the 2DEG channel and therefore significantly increase the resistivity of the high side device during on-state operation. This may be described as virtual negative substrate effect.

A connection of the substrate to the source terminal of the high side device may create similar issues during on-state operation of the low side device.

A solution at the process level to overcome this issue, such as a GaN-on-SOI (Silicon on insulator) process, may lead to increased complexity and less price competitive solutions compared to GaN-on-Silicon solutions.

SUMMARY

While the examples described in the present disclosure relate to group III-nitride semiconductor-based devices, it will be appreciated that devices according to the present disclosure may equally comprise any other suitable semiconductor material, which are based on a heterojunction and feature a two dimensional electron gas e.g. other III-V semiconductor materials such as arsenides and/or phosphides. The disclosure also applies to Indium based on aluminium based arsenides, nitride or phosphides In particular, it is an object of this disclosure to provide an improved monolithic integration of an AlGaN/GaN-on-Silicon heterojunction half bridge which aims to provide a reduction in parasitics and can overcome the issue of substrate connection through advanced layout design.

We describe herein a heterojunction based half bridge apparatus according to independent claim 1 appended hereto, and a III-nitride semiconductor based heterojunction device according to independent claim 7 appended hereto. Further embodiments are defined in the dependent claims appended hereto.

In some examples according to the present disclosure, a semiconductor (e.g. GaN) chip is described which comprises a heterojunction based half bridge apparatus where a drain contact of the low side device has common metallization with (i.e. is electrically connected to) a source contact of the high side device.

We describe herein a heterojunction based half bridge apparatus having a single active area, the heterojunction based half bridge apparatus comprising:
  a. a first heterojunction device on a low side of the heterojunction based half bridge apparatus, the first heterojunction device comprising a first heterojunction interface; and
  b. a second heterojunction device on a high side of the heterojunction based half bridge apparatus, the second heterojunction device comprising a second heterojunction interface;
  c. wherein the first heterojunction interface and the second heterojunction interface are in direct physical contact, and the first heterojunction interface and the second heterojunction interface are continuous with one another;
  d. wherein each of the first and the second heterojunction devices comprises a drain contact and a source contact;
  wherein the drain contact of the first heterojunction device and the source contact of the second heterojunction device are electrically connected by a common metallization layer.

It will be understood that a metallization layer may be disposed on the drain contact of the first heterojunction device and the source contact of the second heterojunction device (i.e. common to the drain contact of the first heterojunction device and the source contact of the second heterojunction device), such that the drain contact of the first heterojunction device and the source contact of the second heterojunction device are electrically connected.

The metallization layer may be a coating.

It will be understood that the first heterojunction device may be a low side device, and that the second heterojunction device may be a high side device.

It will be understood that a "contact" according to the present disclosure may be an area of a surface of semiconductor material to which a metallization layer is applied, e.g. to form an ohmic contact.

The first and/or second heterojunction devices may further comprise a gate contact.

In some examples, the half bridge apparatus may be monolithically integrated.

The first heterojunction device may comprise a heterojunction interface where a two dimensional carrier gas is formed.

The second heterojunction device may comprise a heterojunction interface where a two dimensional carrier gas is formed.

The region of the heterojunction devices where a two dimensional carrier gas is present during on-state operation of the devices may be defined as the active area of the device.

In a half bridge apparatus in prior art the active area of the first heterojunction device and the active area of the second heterojunction device may be isolated from each other.

Different heterojunction devices could be isolated from each-other by using distinctive regions of active areas (active areas are regions that naturally contain two dimensional carrier gas layers, for example heterojunction interfaces). Isolation regions could be placed between devices. These isolation regions have the two dimensional carrier gas disabled by either etching through the heterojunction interface or by appropriate doping or by using etch and fill techniques using for example dielectric materials.

A single active area may be present in some embodiments of the heterojunction based half bridge apparatus described in this invention. A single active area may refer to the combining or merging of the active area of the first heterojunction device and the active area of the second heterojunction device. In such an embodiment, the active area of the first heterojunction device and the active area of the second heterojunction device are continuous with each-other and not isolated from each other.

The half bridge apparatus according to the present disclosure may advantageously lead to a more compact apparatus design in terms of area used on a wafer or substrate. This may be achieved by a reduction in overall metallization, in terms of area of interconnects/tracks (e.g. metal interconnects/tracks) needed to achieve reliable performance at a given current rating; while remaining within the constraints set by common reliability issues related to metal tracks such as electromigration.

For a given fixed area, the half bridge apparatus according to the present disclosure, compared to a conventional design, may differ in the contribution of track resistance (e.g. metal track resistance) to the overall resistance of the transistors which comprise the half bridge design. The half bridge apparatus according to the present disclosure may achieve an overall reduction of track resistances.

In some examples, the drain contacts and source contacts (and gate contacts) may be arranged in an interlaced pattern. It will be understood that an interlaced pattern may comprise e.g. an interwoven and/or interdigitated layout of contacts.

It will be understood that the interlaced pattern may be an interlaced pattern of contacts (i.e. areas of a surface of semiconductor material) and corresponding metallization layers (e.g. disposed on the areas of a surface of semiconductor material).

In some examples, the source contact and/or the drain contact and/or a gate contact of the low side and/or the high side heterojunction device(s) may comprise structures in the form of a finger, i.e. having an elongated shape. For example, the contacts may comprise a finger shape (i.e. an elongated shape). Multiple fingers in parallel may be used to scale up the current in the device.

In some examples, the interlaced pattern may comprise a plurality of interdigitated fingers.

In some examples, the heterojunction based half bridge apparatus may comprise a plurality of first heterojunction devices and/or a plurality of second heterojunction devices, wherein the gate contacts, drain contacts and source contacts are arranged in a repeated pattern of interdigitated fingers, wherein each repetition of the pattern comprises:
  a. a first finger, the first finger comprising the first heterojunction device source contact;
  b. a second finger, the second finger comprising the first heterojunction device gate contact;
  c. a third finger, the third finger comprising the first heterojunction device drain contact and the second heterojunction device source contact;
  d. a fourth finger, the fourth finger comprising the second heterojunction device gate contact; and
  e. a fifth finger, the fifth finger comprising the second heterojunction device drain contact;
  f. wherein adjacent repetitions of the repeated pattern are symmetrical about the fifth finger and/or the first finger.

It will be understood that the third finger may comprise an area of a surface of the heterojunction half bridge apparatus (e.g. an area of a surface of a semiconductor material) that comprises both the first heterojunction device drain contact and the second heterojunction device source contact.

It will be understood that the repeated pattern may be repeated in one dimension of the heterojunction based half bridge apparatus.

It will be further understood that the repeated pattern may terminate at the edges of the heterojunction based half bridge apparatus.

In some examples, the apparatus may comprise a repetitive pattern of interdigitated fingers, where each pattern contains a symmetrical arrangement of a finger for the source of the first heterojunction device (low side device), a finger for the gate of the low side device, a common finger for the drain and the source of the low side device and the second heterojunction device (high side device) respectively, a finger for the gate of the high side device and a finger for the drain of the high side device, where a line of symmetry can be drawn on the middle of the finger for the drain of the high side device.

In some examples, adjacent repetitions of the repeated pattern are symmetrical about the finger for the drain of the high side device (e.g. the fifth finger and/or the first finger). In other words, a line of symmetry can be drawn on the middle of said finger.

The heterojunction based half bridge apparatus according to the present disclosure may achieve reduced parasitic inductances in comparison to a conventional design. Without wishing to be bound by theory, this may result due to the transfer of current from the first (low side) to the second (high side) device being localized to the repetitive arrangement of interdigitated fingers of low side and high side transistors. The reduced parasitic inductance may be desirable as it can lead to reduced oscillations and increased reliability during fast transients.

Additionally, the heterojunction based half bridge apparatus may lead to reduced current loops and therefore changes in the loops of the magnetic field which can reduce mutual inductance and therefore further reduce overall parasitic inductance.

In some examples, the heterojunction based half bridge apparatus may further comprise:
  a. a first terminal layer operatively connected to at least one of the source contacts;
  b. a second terminal layer operatively connected to at least one of the drain contacts;
  c. at least one cross-over region between the first terminal layer and the second terminal layer, wherein the at least one cross-over region is a region in which the first and second terminal layers spatially overlap; and
  d. a dielectric layer disposed between the first terminal layer and the second terminal layer in the at least one cross-over region;
  e. wherein the dielectric layer is configured to support a voltage, in use, that is higher than a breakdown voltage of the heterojunction based half bridge apparatus.

For example, the first terminal layer may be operatively connected to one or more of the source contacts of the second heterojunction device (e.g. one or more of the drain contact fingers of the second heterojunction device).

For example, the second terminal layer may be operatively connected to one or more of the drain contacts of the second heterojunction device (e.g. one or more of the source contact fingers of the second heterojunction device).

The dielectric layer being configured to support a voltage, in use, that is higher than a breakdown voltage of the heterojunction based half bridge apparatus, may advantageously reduce the risk of dielectric breakdown or time dependent dielectric breakdown of the apparatus.

The dielectric layer may be formed from e.g. oxide(s) and/or nitride(s).

The first and second terminal layers may comprise e.g. metallization layers.

The first and second terminal layers may comprise terminal pads and connections between the terminal pads and the contacts. The connections between the terminal pads and the contacts may comprise tracks, e.g. track metallization.

It will be understood that the cross-over region may correspond to a region in which the connections between the terminal pads and the contacts overlap in a plane perpendicular to the planes of the first and second terminal layers. For example, a region in which the tracks overlap.

In some examples, the first and second terminal layers and the contact metallization layers to which they are each operatively connected may each comprise a single layer, e.g. a single metallization layer.

When the apparatus is in use, the first terminal layer may comprise a low voltage terminal.

When the apparatus is in use, the second terminal layer may comprise a high voltage terminal.

In some examples, the cross-over region may be situated away from the source and drain contacts. For example, the cross-over region may be separated from the contacts by a portion of each of the terminal layers, e.g. by a portion of the track metallization. In other words, the cross-over region may be situated outside of the active area of the heterojunction based half bridge apparatus.

We also describe herein a III-nitride semiconductor based heterojunction device having a single active area, the single active area of the III-nitride semiconductor based heterojunction device comprising:
  i. a first heterojunction transistor formed within a first region of the single active area, the first heterojunction transistor comprising:
    1. a first III-nitride semiconductor region comprising a first heterojunction;
    2. a first source contact formed on the first III-nitride semiconductor region;
    3. a first drain contact formed on the first III-nitride semiconductor region and laterally spaced from the first source contact;
    4. a first gate region formed over the first III-nitride semiconductor region between the first source contact and the first drain contact; and
    5. a first gate contact formed on the first gate region;
  ii. a second heterojunction transistor formed within a second region of the single active area, the second heterojunction transistor comprising:
    1. a second III-nitride semiconductor region comprising a second heterojunction;
    2. a second source contact formed on the second III-nitride semiconductor region;
    3. a second drain contact formed on the second III-nitride semiconductor region and laterally spaced from the second source contact;
    4. a second gate region formed over the second III-nitride semiconductor region between the second source contact and the second drain contact; and
    5. a second gate contact formed on the second gate region;
  b. wherein the first heterojunction and the second heterojunction are in direct physical contact, and wherein the first heterojunction and the second heterojunction are continuous with one other; and wherein the first drain contact and the second source contact are electrically connected by a common metallization layer The first heterojunction transistor could be referred to as a low-side heterojunction transistor, meaning, that during forward conduction or forward blocking a source terminal, connected electrically to the first source contact, sits a lower potential than a source terminal of the second heterojunction transistor, connected to the second source contact. The second heterojunction transistor may be referred to as the high-side heterojunction transistor. The low-side and high-side heterojunction transistors may be connected in a half-bridge configuration with the drain of the low-side heterojunction transistor electrically connected to the source of the high-side heterojunction transistor.

The first region of the single active area may be referred to as a low side region. The second region of the single active area may be referred to as a high side region.

The first and second heterojunction transistors comprise heterojunction interfaces (e.g. between GaN and AlGaN) where the two-dimensional electron gases (2DEGs) are formed. By a single active area, it is meant that the active areas of the first heterojunction transistor and the second heterojunction transistor are continuous other, with no separation or isolation between them.

It will be understood that a metallization layer may be disposed on the first drain contact the second source contact (i.e. common to the drain contact of the first heterojunction device and the source contact of the second heterojunction device), such that the first drain contact and the second source contact are electrically connected.

The III-nitride semiconductor based heterojunction device according to the present disclosure may lead to a more compact device in terms of area used on the substrate or wafer. This may be achieved by a reduction in overall metallization, in terms of area of interconnects/tracks (e.g. metal interconnects/tracks) needed to achieve reliable performance at a given current rating; while remaining within the constraints set by common reliability issues related to metal tracks such as electro-migration.

For a given fixed area, the III-nitride semiconductor based heterojunction device according to the present disclosure, compared to a conventional design, may differ in the contribution of track resistance (e.g. metal track resistance) to the overall resistance of the transistors which comprise the half bridge design. The half bridge apparatus according to the present disclosure may achieve an overall reduction of track resistances. This is advantageous as such a device would incur less power losses when in operation.

Additionally, the III-nitride semiconductor based heterojunction device according to the present disclosure may lead to reduced current loops and therefore changes in the loops of the magnetic field which can reduce mutual inductance and therefore further reduce overall parasitic inductance.

In some examples, the first source contact, first gate contact, first drain contact, second source contact, second gate contact, and second drain contact may be arranged in an interlaced pattern.

In some examples, the interlaced pattern may comprise a plurality of interdigitated fingers.

In some examples, the III-nitride semiconductor based heterojunction device may comprise a plurality of first heterojunction transistors and/or second heterojunction transistors, wherein the first source contact, first gate contact, first drain contact, second source contact, second gate contact, and second drain contact are arranged in a repeated pattern of interdigitated fingers, wherein adjacent repetitions of the repeated pattern are symmetrical about the fifth contact.

The III-nitride semiconductor based heterojunction device according to the present disclosure may achieve reduced parasitic inductances in comparison to a conventional design. Without wishing to be bound by theory, this may result due to the transfer of current from the first heterojunction transistor (e.g. low side device) to the second heterojunction transistor (e.g. high side device) being localized to the repetitive arrangement of interdigitated fingers of low side and high side transistors. The reduced parasitic inductance may be desirable as it can lead to reduced oscillations and increased reliability during fast transients.

The first and/or second III-nitride semiconductor regions may comprise a buffer layer and/or a transition layer.

In some examples, the first and second III-nitride semiconductor regions may comprise:
 a. a semiconductor substrate;
 b. a transition layer disposed on the semiconductor substrate;
 c. a buffer layer disposed on the transition layer, the buffer layer comprising gallium nitride (GaN); and
 d. a further layer disposed on the buffer layer, the further layer comprising aluminium gallium nitride (AlGaN);
wherein the first and second heterojunctions are formed between the buffer layer and the further layer.

In some examples, the semiconductor substrate may comprise silicon.

The second gate region may comprise a p-type III-nitride semiconductor material, disposed on the further layer, and wherein the second gate region is configured as a first injector of holes into one or more of the further layer, the buffer layer, and the transition layer.

The p-type III-nitride semiconductor material may comprise p-type gallium nitride (p-GaN).

The second gate region may be configured as a hole injector (e.g. a p-GaN gate of the high side) as it may behave as an injector of holes in the bulk (e.g. where the bulk may refer to a buffer layer and/or a transition layer and/or a further layer of a heterojunction device as illustrated in exemplar embodiments included herein), thus helping with a reduction in the dynamic Ron effect of the low-side device as well as with alleviating or preventing the increase in the on-state resistance of the second heterojunction transistor due to the virtual negative substrate effect (described in the Background section of the present disclosure). The injected holes may help to move the depletion region and the electric field away from the 2DEG layer, downwards towards e.g. the transition layer and/or the substrate.

In some examples, an additional hole injector comprising a floating contact may be included (as described in U.S. patent application Ser. No. 16/740,996, the contents of which is hereby incorporated by reference) and connected in the vicinity of the drain of the high side device. For example, the III-nitride semiconductor based heterojunction device may comprise at least one floating region or structure formed on the second III-nitride semiconductor region, the at least one floating region or structure comprising a p-type III-nitride semiconductor material and configured as a second injector of holes.

A floating structure as described herein may comprise one or more of a region of highly doped III-V semiconductor, a floating contact layer, an injector of carriers, an electron to hole converter, a floating island, and/or a field ring.

As described herein, a floating contact is not electrically connected to an external electrode or biased externally during the on-state and/or off-state operation of the device.

In some examples, the floating structure may comprise p-type GaN.

In some examples, the floating structure comprises a floating contact, and may be connected in the vicinity of the drain of the high side heterojunction device portion.

In some examples, the first and/or second III-nitride semiconductor region(s) is/are configured to support, in a vertical dimension, a voltage that is greater than a voltage rating of the III-nitride semiconductor based heterojunction device by a factor of at least 2.

In some examples, the III-nitride semiconductor based heterojunction device further comprises a first heterojunction transistor and a second heterojunction transistor wherein
 a. the first heterojunction transistor comprises:
 b. a first source terminal electrically connected to the first source contact;
 c. a first drain terminal electrically connected to the first drain contact;
 d. and the second heterojunction transistor comprises:
 e. a second source terminal electrically connected to the second source contact; and
 f. a second drain terminal electrically connected to the second drain contact;
   wherein the first drain terminal of the first heterojunction transistor is electrically connected to the second source terminal of the second heterojunction transistor, and wherein an on-state resistance of the second heterojunction transistor between the second source terminal and the second drain terminal when the second heterojunction transistor is in the on-state is configured to be largely independent of (or virtually unaffected by, or very little affected by) a voltage drop between the first drain terminal and the first source terminal when the first heterojunction transistor is in an off-state.

By "largely independent of (or virtually unaffected by, or very little affected by)", it is meant that the on-state resistance of the second heterojunction transistor (high side transistor) varies very little with the voltage blocked in the off-state by the first heterojunction transistor. For example, when the first heterojunction transistor (the low side transistor) blocks its full rated voltage in the off-state, the on-state resistance of the second heterojunction transistor (the high side transistor) increases by no more than 20%.

In some examples, the vertical breakdown voltage (between the drain terminal and the substrate) of at least one of the first and second heterojunction transistors is higher than the lateral breakdown voltage (between the drain terminal and source terminal) of at least one of the first and second heterojunction transistors by a factor of at least 2.

For example, the layers placed between the substrate and the heterojunction (i.e. the buffer layer and the transition layer) may support at least 2× (preferably more than 3×) the nominal voltage rating of the devices. Alternatively or in addition, the lateral breakdown voltage is at least 2× smaller than the vertical breakdown voltage of the device.

In these examples, the virtual negative substrate effect can be alleviated or even suppressed, as the field built in the III-nitride semiconductor regions (which may comprise buffer and/or transition layers, placed between the substrate and the heterojunction) is significantly lower, thus depleting less (or not depleting) the 2DEG of the high side device (the second heterojunction transistor), when the high side device is operating in the on-state, while the low-side device (the first heterojunction transistor) is in the off-state, blocking a high voltage between its drain and its source terminals.

In some examples, the III-nitride semiconductor based heterojunction device may further comprise an auxiliary gate interface circuit connected to the first gate region, and/or an auxiliary gate interface circuit connected to the second gate region; wherein the auxiliary gate interface circuit(s) is/are monolithically integrated with the III-nitride semiconductor based heterojunction device.

For example, a monolithically integrated circuit (such as the one described in PCT publication no: WO2020/225362, the contents of which is hereby incorporated by reference) may be attached to the gate of the first heterojunction transistor and/or the gate of the second heterojunction transistor.

The auxiliary gate circuit may partly control the voltage and current levels into the first and/or second gate regions.

The auxiliary gate circuit may comprise a GaN transistor, which would preferably be a low voltage device. It will be understood that a "low voltage" device according to the present disclosure is a device that can typically have a rated breakdown below 20V and limited current capability (under 100 mA). However, it should be understood that the auxiliary gate could also comprise a high power or high voltage device, although this may add cost and complexity.

In some examples, the III-nitride semiconductor based heterojunction device according to the present disclosure may further comprise a level shifter circuit monolithically integrated with the III-nitride semiconductor based heterojunction device. At least one on-chip component may be included between the first gate region and the second gate region. The level shifter may comprise at least one low voltage high electron mobility transistor (HEMT).

In some examples, the III-nitride semiconductor based heterojunction device according to the present disclosure may further comprise a gate driver circuit connected to the first gate region, and/or a gate driver circuit connected to the second gate region; wherein the gate driver circuit(s) is/are monolithically integrated with the III-nitride semiconductor based heterojunction device We also describe herein a full bridge circuit comprising two half bridges as described herein. For example, a full bridge circuit may comprise any of: two heterojunction based half bridge apparatuses according to the present disclosure; two III-nitride semiconductor based heterojunction devices according the present disclosure; or one heterojunction based half bridge apparatus according to the present disclosure, and one III-nitride semiconductor based heterojunction device according to the present disclosure.

The half bridge circuit(s) and/or III-nitride semiconductor based heterojunction device(s) may be connected in a monolithically integrated full bridge circuit. Additionally, the connections to a full bridge circuit may be done at package level or system level.

We also describe herein a circuit comprising three half bridges as described herein connected in a three-phase configuration.

For example, a circuit may comprise any of the following connected in a three-phase configuration: three heterojunction based half bridge apparatuses according to the present disclosure; three III-nitride semiconductor based heterojunction devices according to the present disclosure; two heterojunction based half bridge apparatuses according to the present disclosure, and one III-nitride semiconductor based heterojunction device according to the present disclosure; or one heterojunction based half bridge apparatus according to the present disclosure, and two III-nitride semiconductor based heterojunction devices according to the present disclosure. The half bridge apparatus(es) and/or III-nitride semiconductor based heterojunction device(s) may be connected in a monolithically integrated three phase half bridge circuit. Additionally, the connections to a three-phase circuit may be done at package level or system level.

DETAILED DESCRIPTION

Figure 1:
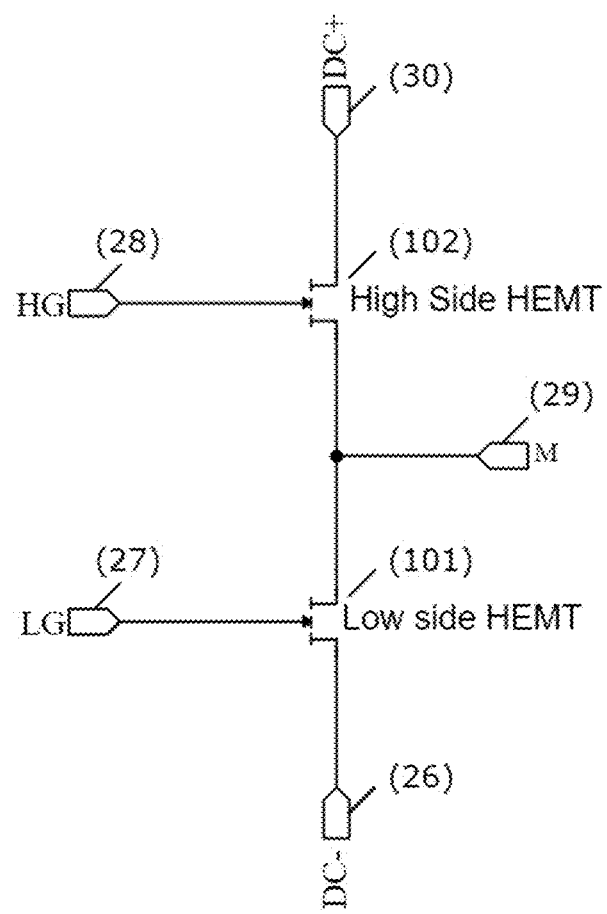
FIG. 1 shows a circuit schematic illustration of a half bridge circuit.

FIG. 1 shows a circuit schematic illustration of a half bridge circuit which comprises a low side HEMT 101, in series with a high side HEMT 102. FIG. 1 illustrates the terminals of a half bridge circuit which comprise: DC− 26, LG 27 (i.e. "low gate"), HG 28 (i.e. "high gate"), M 29 (i.e. "mid-point"), and DC+ 30.

Figure 2:
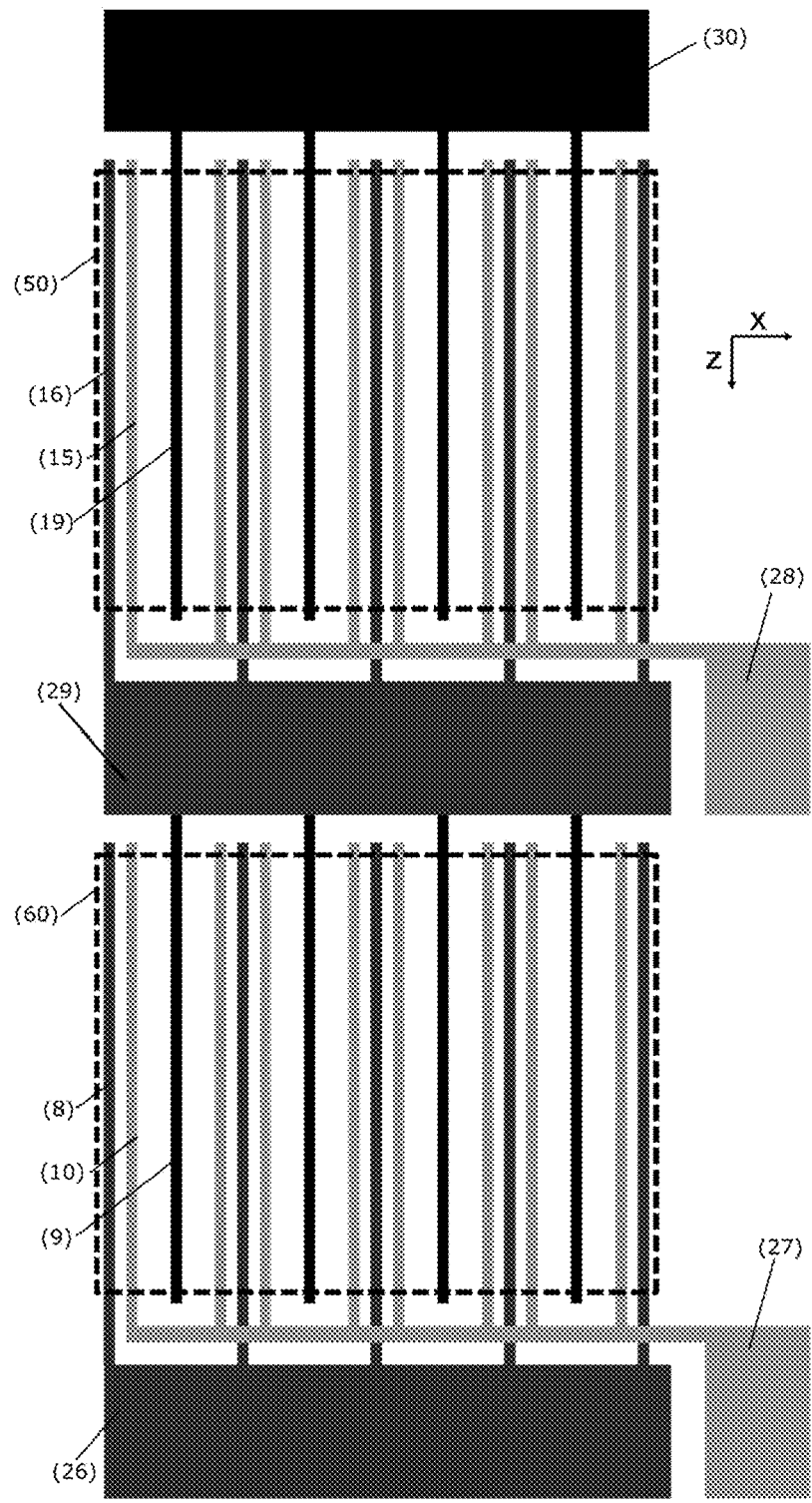
FIG. 2 shows a schematic illustration of a layout top view of a monolithically integrated half bridge.

FIG. 2 shows a schematic illustration of a layout top view of a monolithically integrated half bridge in prior art. The half bridge illustrated in FIG. 2 comprises a source finger of the low side device 8, a gate finger of the low side device 10, a drain finger of the low side device 9, a source finger of the high side device 16, a gate finger of the high side device 15 and a drain finger of a high side device 19.

In the layout example presented in FIG. 2, the half bridge terminals DC− 26, M 29, DC+ 30, LG 27 and HG 28 are shown. DC− 26 is operatively connected to the source contact of the low side devices, DC+ 30 is operatively connected to the drain of the high side device, LG 27 is operatively connected to the gate terminal of the low side devices, HG 28 is operatively connected to the gate terminal of the high side devices. M 29 is operatively connected to the midpoint between the low side and high side device which is the drain terminal of the low side device and the source terminal of the high side device.

An active area of the low side device 60 and an active area of the high side device 50 are also illustrated in FIG. 2. Active area 60 and active area 50 may be isolated from each other by either etching through the heterojunction interface or by appropriate doping or by using etch and fill techniques using for example dielectric materials.

Figure 3:
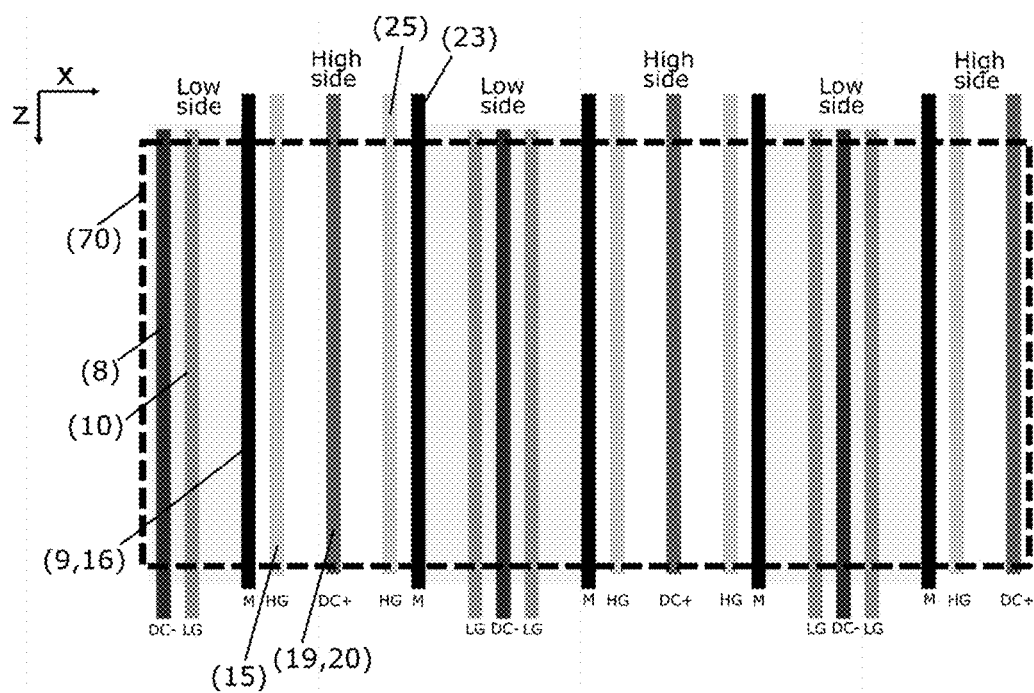
FIG. 3 shows a schematic illustration of a layout top view of the interdigitated half bridge according to the present disclosure.

FIG. 3 shows a schematic illustration of a layout top view of the interdigitated half bridge proposed in this invention which comprises a repetitive pattern of interdigitated fingers, where each pattern contains a symmetrical arrangement of a finger for the source of the low side device (for example finger 8), a finger for the gate of the low side device (for example finger 10), a common finger for the drain (for example finger 9) and the source (for example finger 16) of the low side device and the high side respectively, a finger for the gate of the high side device (for example finger 15) and a finger for the drain of the high side device (for example finger 19), where a line of symmetry can be drawn on the middle of the finger for the drain of the high side device (for example finger 19, 20). In this embodiment the active area of the low side device and the active area of the high side device may be connected such that a single active area 70 is formed (e.g. the active areas of the low side device and the high side device may be continuous with each other).

Figure 4:
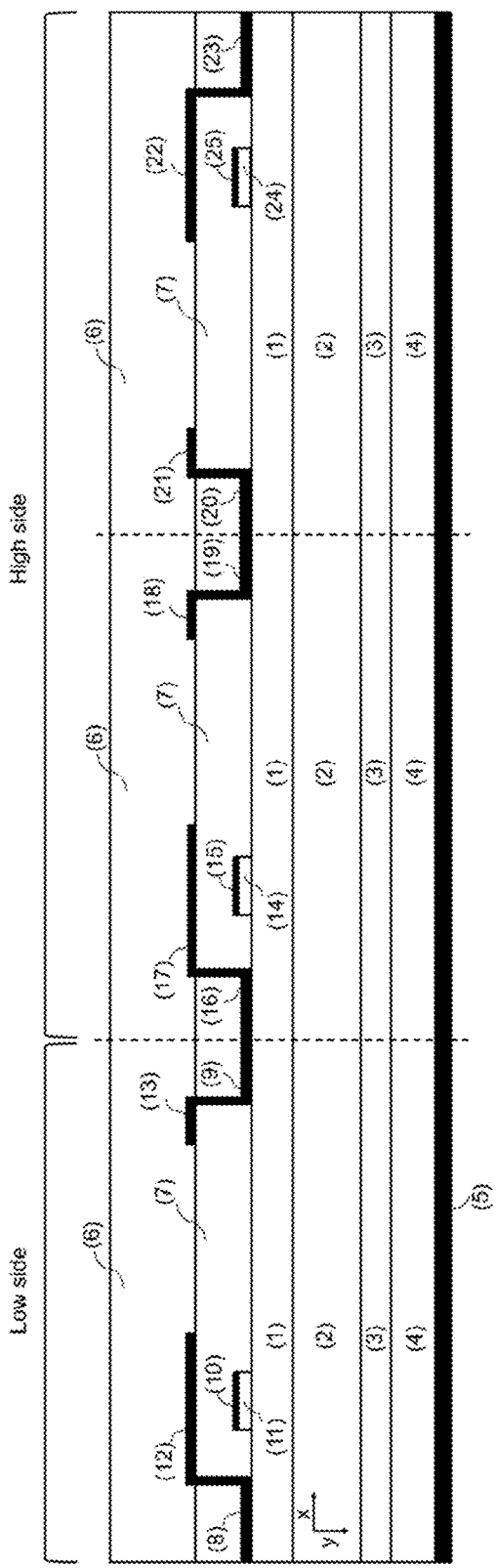
FIG. 4 shows a schematic cross section illustration of the interdigitated half bridge according to the present disclosure.

FIG. 4 shows a schematic cross-section illustration of an example of an interdigitated half bridge according to the present disclosure. The example of FIG. 4 shown in cross-section view illustrates the different layers which form an AlGaN/GaN heterojunction HEMT, which are in this example a silicon substrate 4, a transition layer 3, a GaN buffer layer 2, an AlGaN layer 1, a pGaN region 11, 14, 24, a passivation layer 7, a dielectric layer 6, a substrate terminal 5, gate metal contacts 10, 15, 25 and other metallization layers which may form source or drain ohmic contacts 8, 9, 16, 19, 20, 23 and may be connected to metallization on the passivation layer 7 to form field plate structures 12, 13, 17, 18, 21, 22. A first heterojunction interface may be defined as the interface between the AlGaN layer 1 and the GaN buffer layer 2 in the low side region of the interdigitated half bridge as illustrated in FIG. 4. A second heterojunction interface may be defined as the interface between the AlGaN layer 1 and the GaN buffer layer 2 in the high side region of the interdigitated half bridge as illustrated in FIG. 4.

The cross section illustration in FIG. 4 comprises a repetitive pattern of AlGaN/GaN HEMTs similar to FIG. 3 which contains a symmetrical arrangement of a finger for the source of the low side device (for example contact 8), a finger for the gate of the low side device (for example contact 10), a common finger for the drain (for example contact 9) and the source (for example contact 16) of the low side device and the high side respectively, a finger for the gate of the high side device (for example contact 15) and a finger for the drain of the high side device (for example contact 19), where a line of symmetry can be drawn on the middle of the finger for the drain of the high side device (for example contacts 19, 20).

In this example the p-GaN gate of the high side 14, 15 may behave as an injector of holes in the bulk (where the bulk may be defined as the GaN buffer layer 2 and/or the transition layer 3), thus helping with the dynamic Ron effect of the low-side device as well as with alleviating or preventing the increase in the on-state resistance of the high side device due to virtual negative substrate effect described in the Background section of this disclosure. The injected holes may help to move the depletion region and the electric field away from the 2DEG layer (which exists at the interface of AlGaN layer 1 and GaN layer 2), downwards towards the transition layer 3 and substrate 4.

Figure 5:
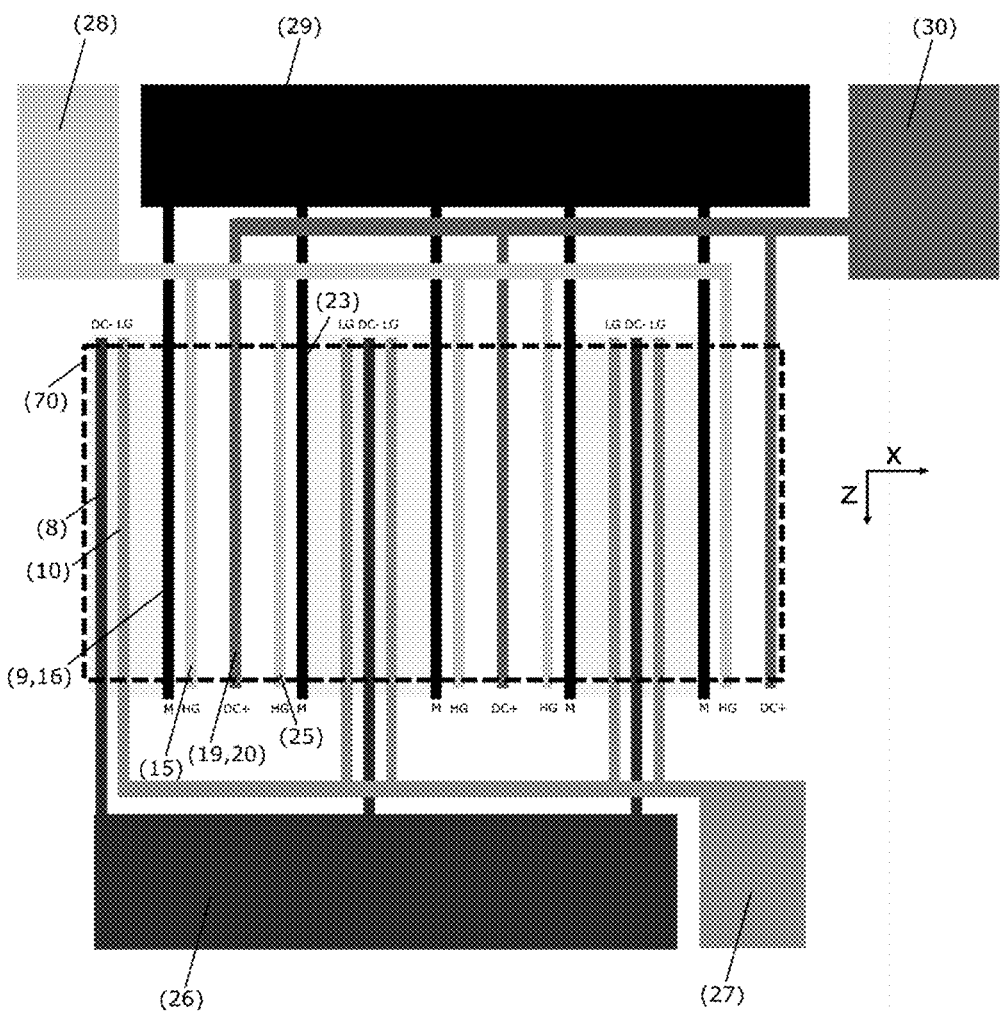
FIG. 5 shows a schematic illustration of a layout top view for an additional embodiment of the interdigitated half bridge according to the present disclosure.

FIG. 5 shows a schematic illustration of a layout top view for an additional embodiment of the interdigitated half bridge proposed in this invention. In this embodiment, which shows a similar repetitive pattern to FIG. 3, the track metallization and metal pads (or terminal pads) outside the interdigitated area of the half bridge are presented. In the layout example presented in FIG. 5, the half bridge terminals DC− 26, M 29, DC+ 30, LG 27 and HG 28 are shown. DC− 26 is operatively connected to the source contact of the low side devices, DC+ 30 is operatively connected to the drain of the high side device, LG 27 is operatively connected to the gate terminal of the low side devices, HG 28 is operatively connected to the gate terminal of the high side devices. M 29 is operatively connected to the midpoint between the low side and high side device which is the drain terminal of the low side device and the source terminal of the high side device. In the embodiment of FIG. 5, the track metallization of half bridge midpoint, M crosses the track metallization of half bridge DC+. In operation, the dielectric material which electrically separates the two track metallizations needs to sustain at least the off-state breakdown voltage of the high side HEMT. This is needed to avoid failure of the overall half bridge at the track metallization crossing site through possible dielectric breakdown or time dependent dielectric breakdown.

Figure 6:
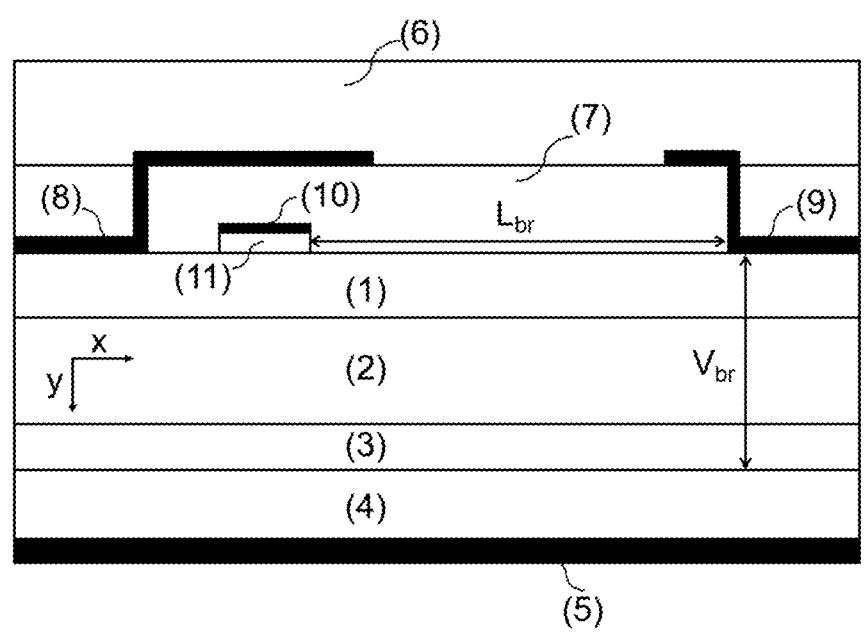
FIG. 6 shows a schematic cross section of an additional embodiment of a heterojunction transistor which can be used in the half bridge according to the present disclosure.

FIG. 6 shows a schematic cross section of an example of a heterojunction transistor similar to the low side transistor presented in FIG. 4. In the heterojunction transistor in FIG. 5 the vertical breakdown voltage may be 2 times (or preferably more than 3 times) higher than the lateral breakdown voltage. The lateral breakdown voltage may be defined as the maximum potential difference which may be sustained between the drain terminal and the gate terminal (dimension $L_{br}$) before excessive leakage or permanent damage occurs in the device. The vertical breakdown voltage may be defined as the maximum potential difference which may be sustained between the drain terminal and the substrate terminal (dimension $V_{br}$) before excessive leakage or permanent damage occurs in the device. It is worth noting that the majority of the potential drop may be in the nitride-based epitaxial layers 1,2,3 rather than the silicon substrate 4 in this example as illustrated in FIG. 6.

A transistor of this type may be used in a monolithically integrated half bridge. Through the use of such a transistor on the high side of a monolithically integrated half bridge, the virtual negative substrate effect can be alleviated or even suppressed, as the electric field peak in the buffer and/or transition layer may reduce in magnitude or be present at a location which is at a greater distance from the 2DEG, thus depleting less (or not depleting) the 2DEG of the high side device.

Figure 7:
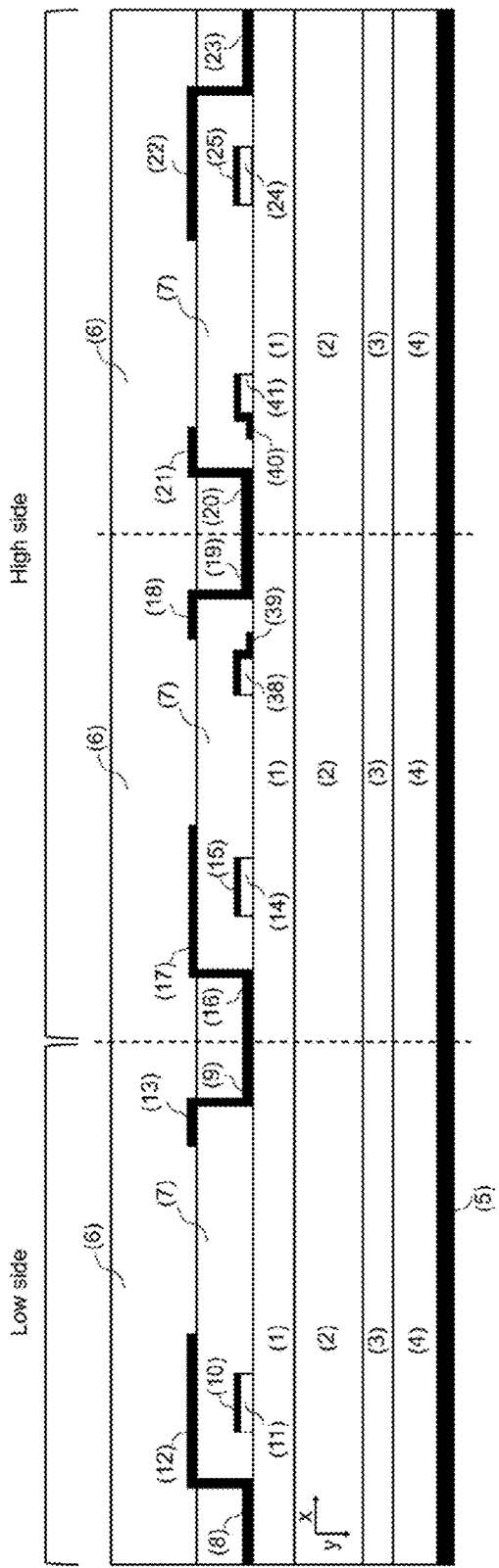
FIG. 7 shows a schematic cross section of an additional embodiment of the interdigitated half bridge according to the present disclosure.

FIG. 7 shows a schematic cross section of an additional embodiment of the interdigitated half bridge proposed in this invention, similar to the embodiment in FIG. 4.

In this embodiment of the interlaced half bridge based on a p-GaN gate technology, an additional hole injector 38, 41 based on a floating contact 39, 40 may be included (as described in U.S. patent application Ser. No. 16/740,996) and connected in the vicinity of the drain of the high side device. Additional embodiments of the hole injector/floating contact structure described in U.S. patent application Ser. No. 16/740,996 may be included in the interlaced half bridge proposed in this invention.

In another embodiment, not illustrated here, the hole injector/floating contact structure may be included in the vicinity of the drain of the low side device.

Figure 8:
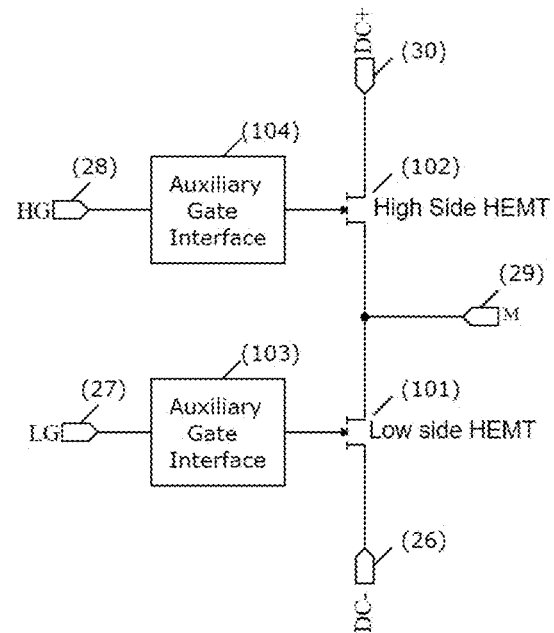
FIG. 8 shows a circuit schematic illustration of an additional embodiment of a half bridge circuit which comprises an auxiliary gate interface connected to the gate of the low side and high side device.

FIG. 8 shows a circuit schematic illustration of an additional embodiment of a half bridge circuit which comprises an auxiliary gate interface 103, 104 connected to the gate of the low side device 101 and the gate of the high side device 102 respectively. The monolithically integrated circuit (such as the one described in PCT publication no: WO2020/225362 which is incorporated here by reference) presented as the auxiliary gate interface block 103, 104 may extend the gate operating voltage range that can be applied to the LG or HG terminal of the half bridge and additionally may offer protection against false turn-on due to transient oscillations. The auxiliary gate interface block may require additional input/output pins, for example a regulated voltage input.

Figure 9:
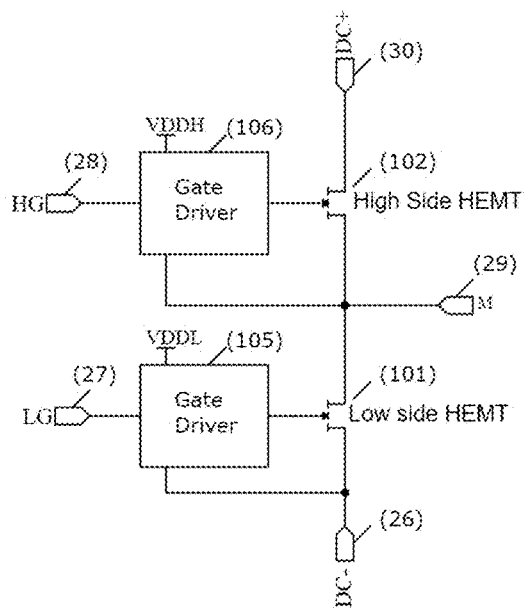
FIG. 9 shows a circuit schematic illustration of an additional embodiment of a half bridge circuit which comprises a gate driver integrated circuit connected to the gate of the low side and high side device.

FIG. 9 shows a circuit schematic illustration of an additional embodiment of a half bridge circuit which comprises a gate driver integrated circuit 105, 106 connected to the gate of the low side device 101 and the gate of the high side device 102 respectively.

Figure 10:
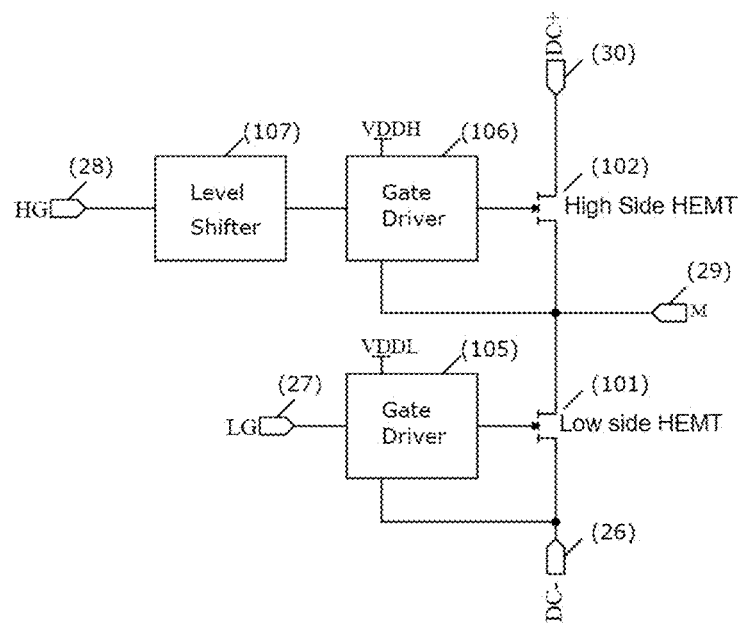
FIG. 10 shows a circuit schematic illustration of an additional embodiment of a half bridge circuit similar to FIG. 9 which comprises an additional monolithically integrated level shifting circuit block.

FIG. 10 shows a circuit schematic illustration of an additional embodiment of a half bridge circuit similar to FIG. 9 which comprises an additional monolithically integrated level shifting circuit block 107.

Figure 11:
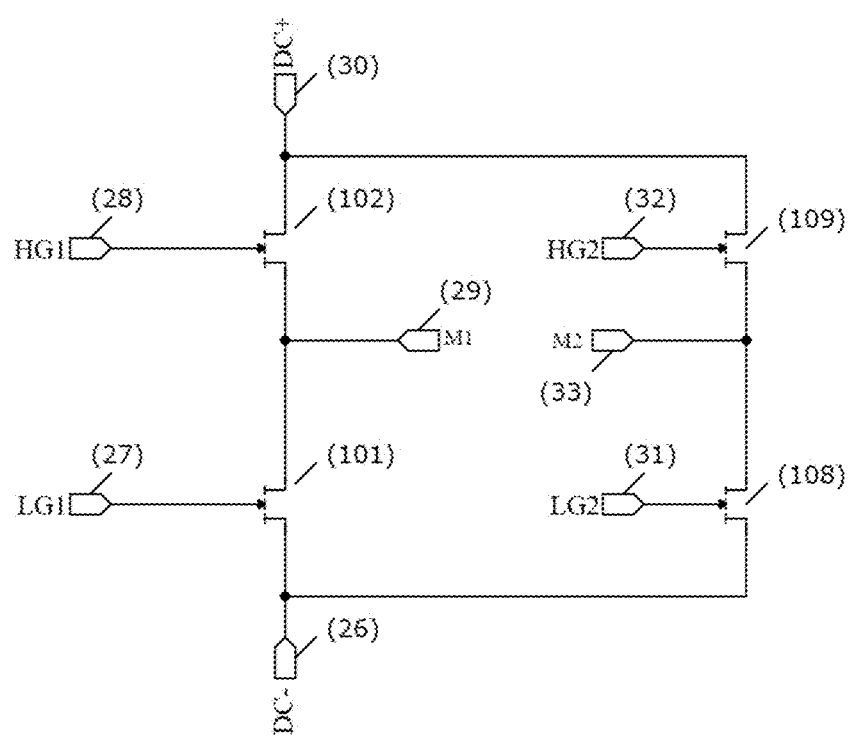
FIG. 11 shows a circuit schematic illustration of two half bridges according to the present disclosure connected in parallel to produce a full bridge configuration.

FIG. 11 shows a circuit schematic illustration of two half bridges according to the present disclosure connected in parallel to produce a full bridge configuration. The parallel connection of two half bridges may be done monolithically, at package level or at printed circuit board level.

Figure 12:
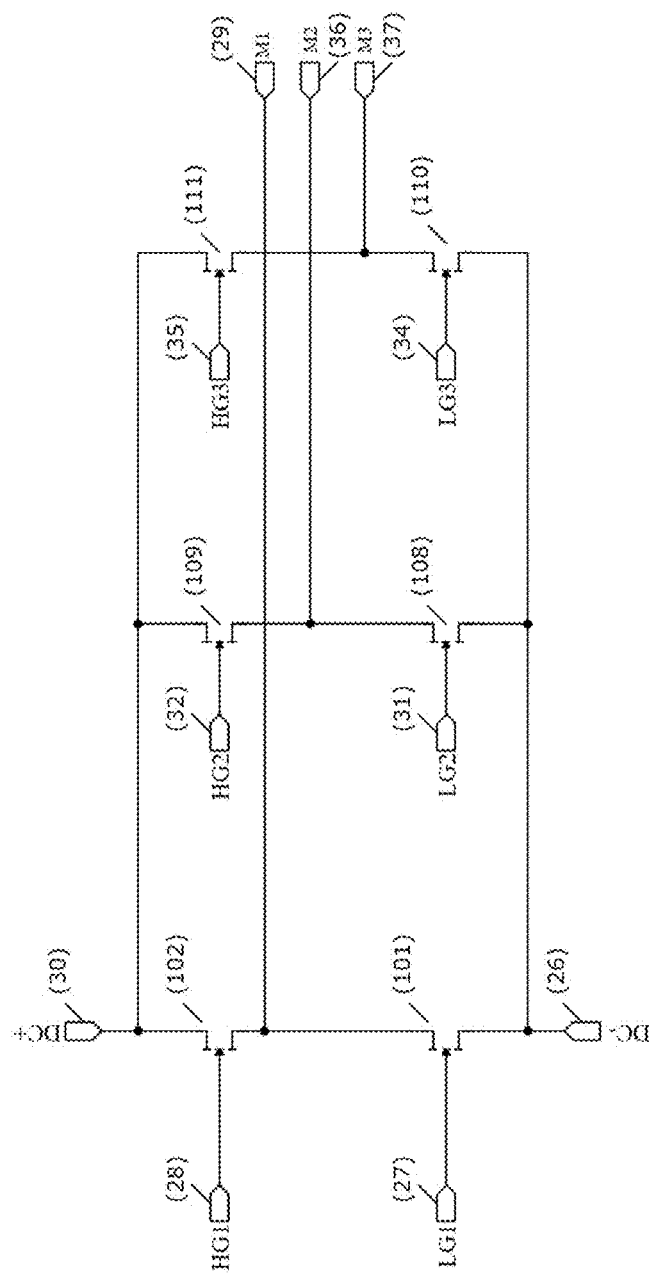
FIG. 12 shows a circuit schematic illustration of three half bridges according to the present disclosure connected in parallel to produce a three-phase half bridge configuration.

FIG. 12 shows a circuit schematic illustration of three half bridges according to the present disclosure connected in parallel to produce a three-phase half bridge configuration. The parallel connection of the three half bridges may be done monolithically, at package level or at printed circuit board level.

In this disclosure the term 'lateral' or 'lateral dimension' may be used to refer to lengths, widths or thicknesses along the x-axis as illustrated in the exemplar embodiments included in this disclosure. Additionally, the word 'vertical' or 'vertical dimension' may be used to refer to lengths, widths or thicknesses along the y-axis as illustrated in the exemplar embodiments included in this disclosure.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

The invention claimed is:

1. A heterojunction based half bridge apparatus having a single active area, the heterojunction based half bridge apparatus comprising:
   a first heterojunction device on a low side of the heterojunction based half bridge apparatus, the first heterojunction device comprising a first heterojunction interface; and
   a second heterojunction device on a high side of the heterojunction based half bridge apparatus, the second heterojunction device comprising a second heterojunction interface;
   wherein the first heterojunction interface and the second heterojunction interface are in direct physical contact, and the first heterojunction interface and the second heterojunction interface are continuous with one another;
   wherein each of the first and the second heterojunction devices comprises a drain contact and a source contact;
   wherein the drain contact of the first heterojunction device and the source contact of the second heterojunction device are electrically connected by a common metallization layer; and
   wherein the second heterojunction device comprises at least one floating region, the at least one floating region comprising a p-type III-nitride semiconductor material and configured as an injector of holes in the vicinity of the drain contact of the second heterojunction device.

2. A heterojunction based half bridge apparatus according to claim 1 wherein each heterojunction device further comprises a gate contact;
   wherein the gate contacts, the drain contacts, and the source contacts are arranged in an interlaced pattern.

3. A heterojunction based half bridge apparatus according to claim 2, wherein the interlaced pattern comprises a plurality of interdigitated fingers.

4. A heterojunction based half bridge apparatus according to claim 3, comprising a plurality of the first heterojunction devices and/or a plurality of the second heterojunction devices, wherein the gate contacts, drain contacts and source contacts are arranged in a repeated pattern of interdigitated fingers, wherein each repetition of the pattern comprises:
   a first finger, the first finger comprising the first heterojunction device source contact;
   a second finger, the second finger comprising the first heterojunction device gate contact;
   a third finger, the third finger comprising the first heterojunction device drain contact and the second heterojunction device source contact;
   a fourth finger, the fourth finger comprising the second heterojunction device gate contact; and
   a fifth finger, the fifth finger comprising the second heterojunction device drain contact;
   wherein adjacent repetitions of the repeated pattern are symmetrical about the fifth finger and/or the first finger.

5. A heterojunction based half bridge apparatus according to claim 1, further comprising:
   a first terminal layer operatively connected to at least one of the source contacts;
   a second terminal layer operatively connected to at least one of the drain contacts;
   at least one cross-over region between the first terminal layer and the second terminal layer, wherein the at least one cross-over region is a region in which the first and second terminal layers spatially overlap; and
   a dielectric layer disposed between the first terminal layer and the second terminal layer in the at least one cross-over region;
   wherein the dielectric layer is configured to support a voltage, in use, that is higher than a breakdown voltage of the heterojunction based half bridge apparatus.

6. A heterojunction based half bridge apparatus according to claim 5, wherein the cross-over region is situated outside of the single active area.

7. A full bridge circuit comprising two heterojunction based interlaced half bridge apparatuses according to claim 1.

8. A circuit comprising a three-phase configuration of three heterojunction based half bridge apparatuses according to claim 1.

9. A III-nitride semiconductor based heterojunction device having a single active area, the single active area of the III-nitride semiconductor based heterojunction device comprising:
- a first heterojunction transistor formed within a first region of the single active area, the first heterojunction transistor comprising:
  - a first III-nitride semiconductor region comprising a first heterojunction;
  - a first source contact formed on the first III-nitride semiconductor region;
  - a first drain contact formed on the first III-nitride semiconductor region and laterally spaced from the first source contact;
  - a first gate region formed over the first III-nitride semiconductor region between the first source contact and the first drain contact; and
  - a first gate contact formed on the first gate region;
- a second heterojunction transistor formed within a second region of the single active area, the second heterojunction transistor comprising:
  - a second III-nitride semiconductor region comprising a second heterojunction;
  - a second source contact formed on the second III-nitride semiconductor region;
  - a second drain contact formed on the second III-nitride semiconductor region and laterally spaced from the second source contact;
  - a second gate region formed over the second III-nitride semiconductor region between the second source contact and the second drain contact;
  - a second gate contact formed on the second gate region; and
  - at least one floating region formed on the second III-nitride semiconductor region, the at least one floating region comprising a p-type III-nitride semiconductor material and configured as a second injector of holes into one or more of the further layer, the buffer layer, and the transition layer;
- wherein the first heterojunction and the second heterojunction are in direct physical contact, and wherein the first heterojunction and the second heterojunction are continuous with one other; and
- wherein the first drain contact and the second source contact are electrically connected by a common metallization layer.

10. A III-nitride semiconductor based heterojunction device according to claim 9,
wherein the first and second III-nitride semiconductor regions comprise:
- a semiconductor substrate;
- a transition layer disposed on the semiconductor substrate;
- a buffer layer disposed on the transition layer, the buffer layer comprising gallium nitride; and
- a further layer disposed on the buffer layer, the further layer comprising aluminium gallium nitride;
wherein the first and second heterojunctions are formed between the buffer layer and the further layer.

11. A III-nitride semiconductor based heterojunction device according to claim 10, wherein the second gate region comprises a p-type III-nitride semiconductor material disposed on the further layer, and wherein the second gate region is configured as a first injector of holes into one or more of the further layer, the buffer layer, and the transition layer.

12. A III-nitride semiconductor based heterojunction device according to claim 11, wherein the second gate region comprises p-type gallium nitride.

13. A III-nitride semiconductor based heterojunction device according to claim 9, wherein the at least one floating region comprises p-type GaN.

14. A III-nitride semiconductor based heterojunction device according to claim 9, wherein the first and/or second III-nitride semiconductor region(s) is/are configured to support, in a vertical dimension, a voltage that is greater than a voltage rating of the III-nitride semiconductor based heterojunction device by a factor of at least 2.

15. A III-nitride semiconductor based heterojunction device according to claim 9, further comprising:
- a first source terminal electrically connected to the first source contact;
- a first drain terminal electrically connected to the first drain contact;
- a second source terminal electrically connected to the second source contact; and
- a second drain terminal electrically connected to the second drain contact;
wherein, when the second heterojunction transistor is in the on-state, an on-state resistance between the second source terminal and the second drain terminal is configured to be largely independent of a voltage drop between the first drain terminal and the first source terminal when the first heterojunction transistor is in an off-state.

16. A III-nitride semiconductor based heterojunction device according to claim 9, wherein a vertical breakdown voltage of one of the first and second heterojunction transistors is higher than a lateral breakdown voltage of at least one of the first and second heterojunction transistors by a factor of at least 2.

17. A III-nitride semiconductor based heterojunction device according to claim 9, further comprising an auxiliary gate interface circuit connected to the first gate region, and/or an auxiliary gate interface circuit connected to the second gate region; wherein the auxiliary gate interface circuit(s) is/are monolithically integrated with the III-nitride semiconductor based heterojunction device.

18. A III-nitride semiconductor based heterojunction device according to claim 9, further comprising a level shifter circuit monolithically integrated with the III-nitride semiconductor based heterojunction device, optionally wherein the level shifter comprises at least one high electron mobility transistor (HEMT).

19. A III-nitride semiconductor based heterojunction device according to claim 9, further comprising a gate driver circuit connected to the first gate region, and/or a gate driver circuit connected to the second gate region; wherein the gate driver circuit(s) is/are monolithically integrated with the III-nitride semiconductor based heterojunction device.

20. A full bridge circuit comprising two III-nitride semiconductor based heterojunction devices according to claim 9.

21. A circuit comprising a three-phase configuration of three III-nitride semiconductor based heterojunction devices according to claim 9.

* * * * *